(12) United States Patent
Wang et al.

(10) Patent No.: US 11,764,706 B2
(45) Date of Patent: Sep. 19, 2023

(54) POWER GENERATOR, SUSPENSION, VEHICLE, APPARATUS FOR PRODUCING POWER GENERATOR, AND METHOD FOR PRODUCING POWER GENERATOR

(71) Applicant: CONTEMPORARY AMPEREX TECHNOLOGY CO., LIMITED, Ningde (CN)

(72) Inventors: Zhichao Wang, Ningde (CN); Liwen Jiang, Ningde (CN); Rong Cao, Ningde (CN); Wumei Fang, Ningde (CN)

(73) Assignee: CONTEMPORARY AMPEREX TECHNOLOGY CO., LIMITED, Ningde (CN)

( * ) Notice: Subject to any disclaimer, the term of this patent is extended or adjusted under 35 U.S.C. 154(b) by 98 days.

(21) Appl. No.: 17/528,573

(22) Filed: Nov. 17, 2021

(65) Prior Publication Data
US 2022/0149755 A1 May 12, 2022

Related U.S. Application Data

(63) Continuation of application No. PCT/CN2020/127374, filed on Nov. 7, 2020.

(51) Int. Cl.
*H02N 2/18* (2006.01)
*B60G 7/00* (2006.01)

(52) U.S. Cl.
CPC ............ *H02N 2/186* (2013.01); *B60G 7/001* (2013.01)

(58) Field of Classification Search
CPC .................................. H02N 2/18; B60G 7/001
See application file for complete search history.

(56) References Cited

U.S. PATENT DOCUMENTS 8,030,826 B2   10/2011  Lee
9,837,938 B2 * 12/2017  Maruyama ............... H02N 2/22
(Continued)

FOREIGN PATENT DOCUMENTS

CN    101643008 A    2/2010
CN    102673337 A    9/2012
(Continued)

OTHER PUBLICATIONS

Extended European Search Report dated Apr. 13, 2022 received in European Patent Application No. EP 20931709.8.

*Primary Examiner* — J. San Martin
(74) *Attorney, Agent, or Firm* — Scully, Scott, Murphy & Presser, P.C.

(57) ABSTRACT

The present application provides a power generator, a suspension, a vehicle, an apparatus and a method for producing a power generator. Among them, the power generator comprises a cylinder body, a moving member, and a piezoelectric conversion unit. The moving member and the cylinder body jointly defines a variable cavity. The piezoelectric conversion unit is located in the variable cavity, and the piezoelectric conversion unit is configured to deform when the moving member is in relative motion with respect to the cylinder body move and changes the size of the variable cavity, for generating electric energy. Due to the fact that the piezoelectric conversion unit is arranged in the variable cavity, the moving member is in relative motion with respect to the cylinder body to make the piezoelectric conversion unit generate electric energy, thus effectively utilizing the energy generated by the target members in the vibration process.

13 Claims, 9 Drawing Sheets

(56) References Cited

U.S. PATENT DOCUMENTS

| | | |
|---|---|---|
| 2002/0121416 A1 | 9/2002 | Katayama et al. |
| 2010/0052475 A1 | 3/2010 | Lee |
| 2013/0214532 A1* | 8/2013 | Hsu .......................... F03D 5/00 290/43 |

FOREIGN PATENT DOCUMENTS

| | | |
|---|---|---|
| CN | 103267081 A | 8/2013 |
| CN | 102664556 B | 10/2014 |
| CN | 104165204 B | 5/2016 |
| CN | 205479089 U | 8/2016 |
| CN | 206017546 U | 3/2017 |
| EP | 2541753 A2 | 1/2013 |

\* cited by examiner

POWER GENERATOR, SUSPENSION, VEHICLE, APPARATUS FOR PRODUCING POWER GENERATOR, AND METHOD FOR PRODUCING POWER GENERATOR

CROSS-REFERENCE TO RELATED APPLICATIONS

This application is a continuation of International Application No. PCT/CN2020/127374, filed on Nov. 7, 2020, the disclosure of which is hereby incorporated by reference in its entirety.

TECHNICAL FIELD

The present application relates to the technical field of vehicles, and in particular to a power generator, a suspension, a vehicle, an apparatus for producing a power generator, and a method for producing a power generator.

BACKGROUND

In a shock absorption structure, a shock absorption member (such as a shock absorber) is generally arranged between two target members, the shock absorption member absorbs energy in the vibration process of the target members to achieve the purpose of shock absorption. However, energy generated in the vibration process of the target members is wasted, and the energy generated by vibration cannot be effectively utilized. For example, in a vehicle, when the shock absorber in a suspension is used for shock absorption of a frame, energy generated by the frame in the vibration process is wasted.

SUMMARY

An embodiment of the present application provides a power generator, a suspension, a vehicle, an apparatus for producing a power generator, and a method for producing a power generator, thus improving the problem that energy generated by vibration objects in the vibration process may not be effectively utilized in a shock absorption structure.

In a first aspect, the embodiment of the present application provides a power generator, comprising:
  a cylinder body;
  a moving member, the moving member jointly defines a variable cavity with the cylinder body;
  a piezoelectric conversion unit, the piezoelectric conversion unit is located in the variable cavity, and the piezoelectric conversion unit is configured to deform when the moving member is in relative motion with respect to the cylinder body and changes the size of the variable cavity, for generating electric energy.

In above solution, due to the fact that the piezoelectric conversion unit is arranged in the variable cavity jointly defined by the moving member and the cylinder body, when the moving member is in relative motion with respect to the cylinder body and changes the size of the variable cavity, the piezoelectric conversion unit is deformed to generate electric energy, thus converting mechanical energy generated by the relative motion of the moving member with respect to the cylinder body into electric energy. After the cylinder body and the moving member are respectively connected to two target members, when the target members vibrate due to relative motion, the moving member is in relative motion with respect to the cylinder body to make the piezoelectric conversion unit generate electric energy, thus effectively utilizing the energy generated by the target members in the vibration process.

In addition, the power generator provided by the embodiment of the present application is further provided with the following additional technical features:

In some embodiments, the piezoelectric conversion unit is configured to deform under compression by the action of a medium in the variable cavity.

In above solution, the piezoelectric conversion unit is deformed under compression by the action of the medium in the variable cavity, that is, the medium in the variable cavity plays a role in transferring force; when the moving member is in relative motion with respect to the cylinder body to reduce the variable cavity, the medium in the variable cavity transfers an external force applied to the moving member or the cylinder body to the piezoelectric conversion unit, and the piezoelectric conversion unit is deformed under the pressure applied by the medium to generate electric energy.

In some embodiments, the power generator further comprises:
  a medium conveying device, the medium conveying device is communicated with the variable cavity, and the medium conveying device is used for providing the medium for the variable cavity when the variable cavity becomes larger, and is used for storing the medium flowing out of the variable cavity when the variable cavity becomes smaller.

In above solution, the medium conveying device may provide the medium for the variable cavity when the variable cavity becomes larger as well as accommodate the medium flowing out of the variable cavity when the variable cavity becomes smaller, that is, in the process that the moving member or the cylinder body reciprocates due to vibration of the target member, when the variable cavity becomes larger, the medium conveying device inputs the medium into the variable cavity; when the variable cavity becomes smaller, the medium flowing out of the variable cavity enters the medium conveying device. Such structure may guarantee occurrence of relatively large displacement between the moving member and the cylinder body.

In some embodiments, the medium conveying device is an elastomer with an expandable internal space;
  the internal space of the elastomer is communicated with the variable cavity.

In above solution, the medium conveying device is an elastomer with an expandable internal space, when the variable cavity becomes smaller, the medium flowing out of the variable cavity enters the elastomer, and the elastomer expands; and when the variable cavity becomes larger, the elastomer inputs the medium into the variable cavity, and the elastomer shrinks. The medium conveying device with such structure is simple in structure and may be automatically adaptive to the change of the variable cavity.

In some embodiments, the moving member is provided with an extension end movably arranged in the cylinder body;
  the piezoelectric conversion unit is installed on the cylinder body and faces the extension end.

In above solution, due to the face that the piezoelectric conversion unit faces the extension end, located in the cylinder body, of the moving member, when the moving member is in relative motion with respect to the cylinder body to reduce the variable cavity, an extrusion force applied to the medium in the variable cavity by the extension end may be transferred to the piezoelectric conversion unit through the medium more effectively, and thus the piezoelectric conversion unit is easier to deform, and conversion efficiency of converting mechanical energy generated by relative motion of the moving member with respect to the cylinder body into electric energy is improved.

In some embodiments, the cylinder body comprises:
a cylinder main body, an accommodating space with an opening at one end is formed inside the cylinder main body, the extension end is located in the accommodating space; and
a cover body, the cover body is used for covering the opening, and the piezoelectric conversion unit is used for being installed on one side, facing the extension end, of the cover body.

In above solution, the cylinder body comprises two portions: a cylinder main body and a cover body, the cover body is used for covering the opening of the cylinder main body, and the cylinder body is of a split structure convenient for installing and detaching the piezoelectric conversion unit.

In some embodiments, the cylinder body further comprises:
a locking member, the locking member is used for locking the cover body to the cylinder main body.

In above solution, the cover body is locked to the cylinder main body through the locking member, and the firmness after covering the cover body on the opening of the cylinder main body is enhanced.

In some embodiments, the cylinder body is provided with a limiting part;
the piezoelectric conversion unit is installed on the cylinder body, a gap exists between the piezoelectric conversion unit and the limiting part, and the piezoelectric conversion unit is capable of abutting against the limiting part when deformed in the direction close to the limiting part.

In above solution, the cylinder main body is provided with the limiting part, the gap exists between the limiting part and the piezoelectric conversion unit to guarantee that the piezoelectric conversion unit may generate a certain extent of deformation in the direction close to the limiting part in the process that the moving member is in relation motion with respect to the cylinder body, for generating electric energy. The limiting part has a certain restraining effect on deformation of the piezoelectric conversion unit, when the piezoelectric conversion unit is deformed in the direction close to the limiting part and abuts against the limiting part, the piezoelectric conversion unit no longer continues to deform, and the piezoelectric conversion unit is not prone to being damaged due to excessive deformation.

In some embodiments, a groove is provided on an inner wall of the cylinder body;
the piezoelectric conversion unit covers an opening end of the groove;
the limiting part is a groove bottom wall of the groove, and the piezoelectric conversion unit is capable of abutting against the groove bottom wall when depressed into the groove to deform.

In above solution, the groove is provided on the inner wall of the cylinder body, the piezoelectric conversion unit covers the opening end of the groove, the groove of the cylinder body makes a space needed for deformation of the piezoelectric conversion unit, and thus the piezoelectric conversion unit may be depressed into the groove to deform. In the process that the piezoelectric conversion unit is depressed into the groove to deform, the piezoelectric conversion unit may abut against the groove bottom wall of the groove, and the piezoelectric conversion unit is not prone to being damaged due to excessive deformation.

In some embodiments, the piezoelectric conversion unit comprises:
a pressure conduction plate, the pressure conduction plate covers the opening end of the groove, the pressure conduction plate is configured to deform when the moving member is in relative motion with respect to the cylinder body and changes the size of the variable cavity; and
a piezoelectric plate, the piezoelectric plate is installed on one side, which faces the groove, of the pressure conduction plate, and the gap is formed between an end face, away from the pressure conduction plate, of the piezoelectric plate and the groove bottom wall, and the piezoelectric plate is configured to generate electric energy when deformed along with the deformation of the pressure conduction plate.

In above solution, the piezoelectric plate is a power generating element, the pressure conduction plate may drive the piezoelectric plate to deform to generate the electric energy. Due to the fact that the pressure conduction plate covers the opening end of the groove, the piezoelectric plate is installed at one side, which faces the groove, of the pressure conduction plate, the pressure conduction plate blocks the piezoelectric plate in the groove, the piezoelectric plate may be well protected by the pressure conduction plate, and the service life of the piezoelectric plate is prolonged.

In some embodiments, the cylinder body is provided with a threaded hole communicated with the groove, and the threaded hole is used for a wire of the piezoelectric plate to penetrate out of the internal of the cylinder body.

In above solution, the cylinder body is provided with the threaded hole communicated with the groove, the threaded hole is provided for the wire of the piezoelectric plate to penetrate out, thus leading out electric energy generated by the deformation of the piezoelectric plate.

In some embodiments, the gap is 1 mm to 5 mm.

In above solution, the gap between the limiting part and the piezoelectric conversion unit is 1 mm to 5 mm, the piezoelectric conversion unit is ensured to have good power generation capacity, and the piezoelectric conversion unit is not prone to being damaged due to excessive deformation.

In a second aspect, the embodiment of the present application provides a suspension for being connected between a frame and a wheel, comprising:
a connecting arm for installing a wheel; and
the power generator mentioned above, one of the cylinder body and the moving member is connected to the connecting arm, and the other one of the two is used for being connected to the frame.

In above solution, one of the cylinder body and the moving member is connected to the connecting arm, the other one of the two is used for being connected to the frame, and the power generator may play a role in shock absorption between the connecting arm and the frame. In the vibration process of the frame, the moving member is in relative motion with respect to the cylinder body, the size of the variable cavity is changed, the piezoelectric conversion unit is deformed to generate electric energy, thus effectively utilizing the energy generated by the frame in the vibration process.

In a third aspect, the embodiment of the present application provides a vehicle, comprising the suspension mentioned above.

In above solution, the power generator in the suspension of the vehicle may generate power in the vibration process of the frame, thus sufficiently utilizing energy generated by the frame in the vibration process.

In a fourth aspect, the embodiment of the present application provides an apparatus for producing a power generator, comprising:

a providing device for providing a cylinder body, a moving member, and a piezoelectric conversion unit; and an installing device for installing the cylinder body, the moving member, and the piezoelectric conversion unit, to make the piezoelectric conversion unit be located in a variable cavity jointly defined by the moving member and the cylinder body, where the piezoelectric conversion unit is configured to deform when the moving member is in relative motion with respect to the cylinder body and changes the size of the variable cavity, for generating electric energy.

In a fifth aspect, the embodiment of the present application provides a method for producing a power generator, comprising:

providing a cylinder body, a moving member, and a piezoelectric conversion unit;

and installing the cylinder body, the moving member, and the piezoelectric conversion unit together, to make the piezoelectric conversion unit be located in a variable cavity jointly defined by the moving member and the cylinder body, where the piezoelectric conversion unit is configured to deform when the moving member is in relative motion with respect to the cylinder body and changes the size of the variable cavity, for generating electric energy.

BRIEF DESCRIPTION OF DRAWINGS

To describe the technical solutions in the embodiments of the present application more clearly, the following briefly introduces the accompanying drawings required for describing the embodiments of the present application. Apparently, the accompanying drawings in the following description show merely some embodiments of the present application, and those of ordinary skill in the art may still derive other drawings from these accompanying drawings without creative efforts.

Figure 1:
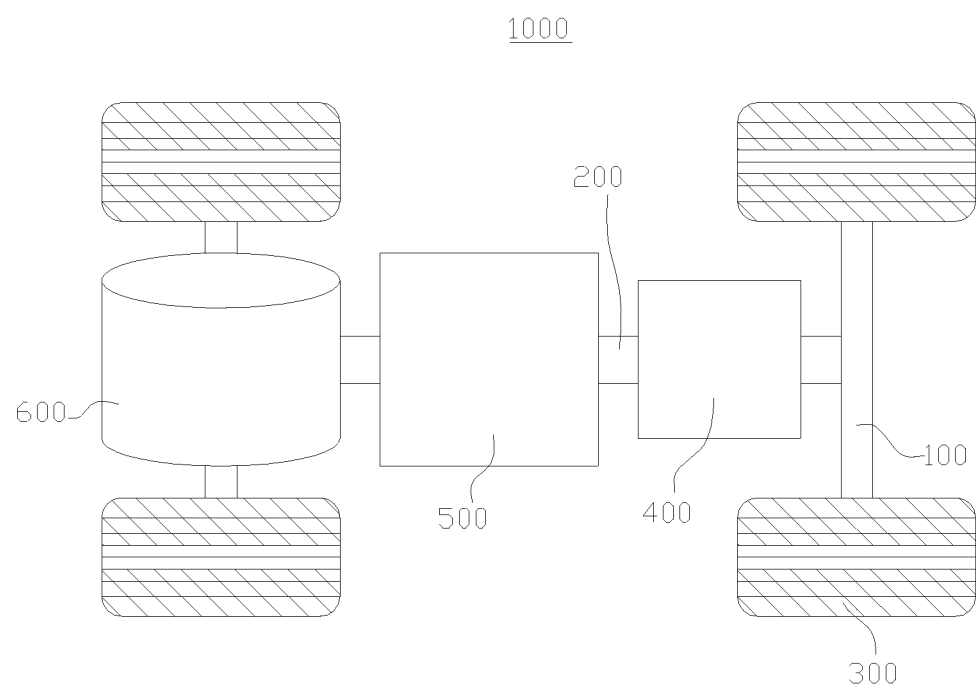
FIG. 1 is a structure diagram of a vehicle provided by some embodiments of the present application.

In the drawings, the accompanying drawings are not drawn to actual scale.

Numeral description: 10—power generator; 11—cylinder body; 111—cylinder main body; 1111—opening; 1112—accommodating space; 1113—penetrating end; 1114—through hole; 112—cover body; 1121—threaded hole; 113—locking member; 114—limiting part; 115—gap; 116—groove; 12—moving member; 121—extension end; 122—free end; 123—rod part; 124—head part; 13—piezoelectric conversion unit; 131—pressure conduction plate; 132—piezoelectric plate; 133—wire; 14—variable cavity; 15—medium conveying device; 151—communicating pipe; 16—force transfer member; 20—connecting arm; 100—suspension; 200—frame; 300—wheel; 400—battery; 500—controller; 600—motor; 1000—vehicle; 1100—providing device; 1200—installing device; 2000—apparatus for producing power generator.

DESCRIPTION OF EMBODIMENTS

The embodiments of the present application are further described in detail below with reference to the accompanying drawings and the embodiments. The following detailed description of the embodiments and the accompanying drawings are provided to illustrate the principles of the present application and are not intended to limit the scope of the present application, that is, the present application is not limited to the described embodiments.

In the description of the present application, it should be noted that, unless otherwise specified, "a plurality" means two or more; an orientation or positional relationship indicated by the terms "upper," "lower," "left," "right," "inner," "outer," and the like is merely for convenience in describing the present application and simplifying the description rather than indicating or implying that the referenced devices or elements must have a particular orientation, be constructed and operated in a particular orientation, and thus should not be construed as limiting the present application. In addition, the terms "first", "second", "third" and the like are used for descriptive purposes only and are not to be construed as indicating or implying relative importance. "Vertical" is not strictly vertical, but within the tolerance range. "Parallel" is not strictly parallel, but within the tolerance range.

The directional terms in the following description are all directions shown in the drawings, and are not intended to limit the specific structure of the present application. In the description of the present application, it also should to be noted that, unless otherwise explicitly specified or limited, the terms "installed," "connected," and "connection" are to be construed broadly, for example, either a fixed connection, a detachable connection, or an integral connection; direct connection or indirect connection through an intermediate. The specific meaning of the above terms in the present application may be understood as appropriate by those of ordinary skill in the art.

At present, in a shock absorption structure, a shock absorption member (such as a shock absorber) is generally arranged between two target members, the shock absorption member absorbs energy in the vibration process of the target members to achieve the purpose of shock absorption. However, energy generated in the vibration process of the target members is wasted, and the energy generated by vibration may not be effectively utilized.

To this end, the present application provides a technical solution, a piezoelectric conversion is arranged in a variable cavity defined by a moving member and a cylinder body, the piezoelectric conversion unit is deformed when the moving member is in relative motion with respect to the cylinder body to generate electric energy, and mechanical energy is converted into electric energy to achieve sufficient utilization of the energy (mechanical energy) generated by vibration objects in the vibration process.

It should be noted that the technical solution described by the embodiments of the present application are all suitable for vehicle, the vehicle may be a fuel oil vehicle, a gas vehicle, or a new energy vehicle, and the new energy vehicle may be a battery electric vehicle, a hybrid electric vehicle, or a range-extended electric vehicle. The embodiments of the present application are not particularly limited to the vehicle.

For convenience of illustration, the following examples are illustrated with the vehicle as a new energy vehicle.

Please refer to FIG. 1, FIG. 1 is a structure diagram of a vehicle 1000 provided by some embodiments of the present application. The vehicle 1000 provided by the embodiments of the present application comprises a suspension 100, a frame 200, and a wheel 300; the suspension 100 is connected between the frame 200 and the wheel 300, and main function of the suspension 100 is transferring force and moment acted between the wheel 300 and the frame 200.

In some embodiments, the vehicle 1000 further comprises a battery 400, and the battery 400 may be arranged at the bottom or head or tail of the vehicle 1000. The battery 400 may be used for power supply of the vehicle 1000, for example, the battery 400 may serve as an operational power source of the vehicle 1000. The battery 400 may be installed on the frame 200.

The vehicle 1000 may further comprise a controller 500 and a motor 600; the controller 500 is used for controlling the battery 400 to supply power to the motor 600, for example, for operating power needs during startup, navigation, and driving of the vehicle 1000. The controller 500 and the motor 600 may both be installed on the frame 200.

In some embodiments, the battery 400 may not only serve as an operational power source of the vehicle 1000, but also as a drive power source of the vehicle 1000, to provide driving power for the vehicle 1000 instead of or partially instead of fuel oil or natural gas.

The battery 400 provided by the embodiments of the present application refers to a single physical module including one or more battery cells to provide higher voltage or capacity. For example, the battery 400 mentioned in the present application may comprise a battery module, or a battery pack and the like. The battery 400 generally comprises a box body for packaging one or more battery cells, and the box body may prevent liquid or other foreign matters from affecting charging or discharging of the battery cell.

In the present application, the battery cell may comprise a lithium-ion secondary battery, a lithium-ion primary battery, a lithium-sulfur battery, a sodium-lithium-ion battery, a sodium-ion battery, or a magnesium-ion battery and the like, which is not limited in the embodiments of the present application. The battery cell may be of cylindrical, flat, rectangular, or other shapes, which is also not limited in the embodiments of the present application. In general, the battery cell is divided into three types according to a packaging mode: a cylindrical battery cell, a square battery cell, and a soft package battery cell, which is also not limited in the embodiments of the application.

The battery cell comprises an electrode assembly and electrolyte, and the electrode assembly is composed of a positive plate, a negative plate, and a separator. The battery cell works mainly on the movement of metal ions between the positive plate and the negative plate. The positive plate comprises a positive current collector and a positive active material layer, the positive active material layer is coated on a surface of the positive current collector, and the current collector uncoated with the positive active material layer protrudes out of the current collector coated with the positive active material layer, and the current collector uncoated with the positive electrode active material layer serves as a positive electrode tab. Taking the lithium-ion battery as an example, the positive current collector may be made of aluminum, and the positive active material may be lithium cobalt oxide, lithium iron phosphate, ternary lithium, or lithium manganate. The negative plate comprises a negative current collector and a negative active material layer, the negative active material layer is coated on a surface of the negative current collector, and the current collector uncoated with the negative active material layer protrudes out of the current collector coated with the negative active material layer, and the current collector uncoated with the negative electrode active material layer serves as a negative electrode tab. The negative current collector may be made of copper, and the negative active material may be carbon or silicon. To guarantee that no fusing occurs while a large current passes through, a plurality of positive electrode tabs are stacked together, and a plurality of negative electrode tabs are stacked together. The separator may be made of PP, or PE, and the like. In addition, the electrode assembly may be a wound structure or may be a laminated structure, and embodiments of the present application are not limited thereto.

Figure 2:
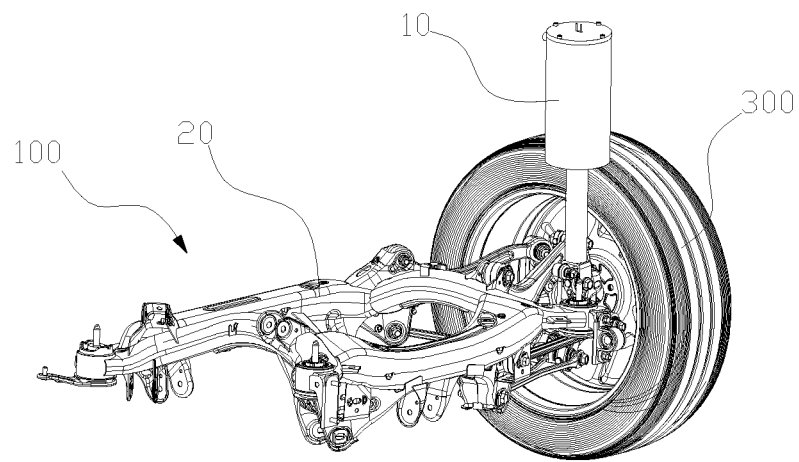
FIG. 2 is a structure diagram of a suspension provided by some embodiments of the present application.

Please refer to FIG. 2, the FIG. 2 is a structure diagram of a suspension 100 provided by some embodiments of the present application. The suspension 100 provided by the embodiments of the present application comprises a power generator 10 and a connecting arm 20. The wheel 300 is used for being installed on the connecting arm 20, and the connecting arm 20 is used for being connected to the frame 200 (not shown in FIG. 2) in a swingable manner. The power generator 10 is connected to the connecting arm 20 and used for being connected to the frame 200.

The power generator 10 is connected between the connecting arm 20 and the frame 200. On the one hand, the power generator 10 may play a role in vibration and shock absorption, and on the other hand, the power generator 10 may convert mechanical energy generated in the vibration process of the frame 200 into electric energy, thus effectively utilizing the energy generated in the vibration process of the frame 200. The specific structure of the power generator 10 is set forth in detail below with reference to the accompanying drawings.

Figure 3:
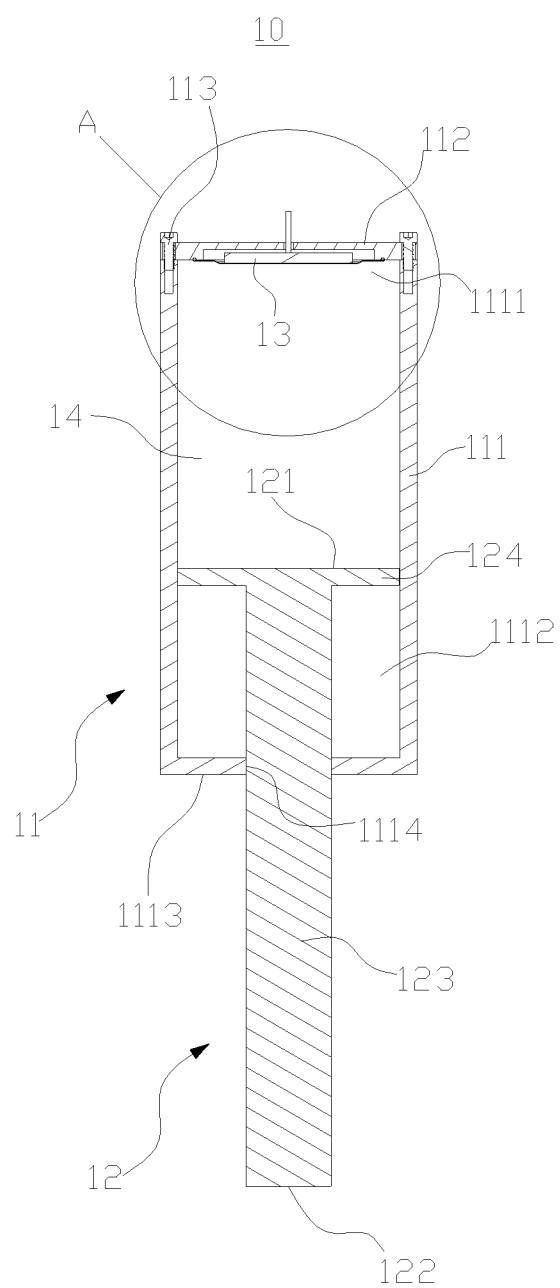
FIG. 3 is a structure diagram of a power generator provided by some embodiments of the present application.

Please refer to FIG. 3, the FIG. 3 is a structure diagram of a power generator 10 provided by some embodiments of the present application. The power generator 10 provided by the embodiments of the present application comprises a cylinder body 11, a moving member 12, and a piezoelectric conversion unit 13, where the moving member 12 and the cylinder body 11 jointly defines a variable cavity 14; the piezoelectric conversion unit 13 located in the variable cavity 14, and the piezoelectric conversion unit 13 is configured to deform when the moving member 12 is in relative motion with respect to the cylinder body 11 and changes the size of the variable cavity 14, for generating electric energy.

Due to the fact that the piezoelectric conversion unit 13 is arranged in the variable cavity 14 jointly defined by the moving member 12 and the cylinder body 11, on the one hand, the piezoelectric conversion unit 13 may be well protected, on the other hand, when the moving member 12 is in relative motion with respect to the cylinder body 11 and changes the size of the variable cavity 14, the piezoelectric conversion unit 13 is deformed to generate electric energy, thus converting mechanical energy generated by the relative motion of the moving member 12 with respect to the cylinder body 11 into electric energy.

The relative motion of the moving member 12 with respect to the cylinder body 11 may be understood in that the moving member 12 moves relative to the cylinder body 11, or the cylinder body 11 moves relative to the moving member 12.

Figure 4:
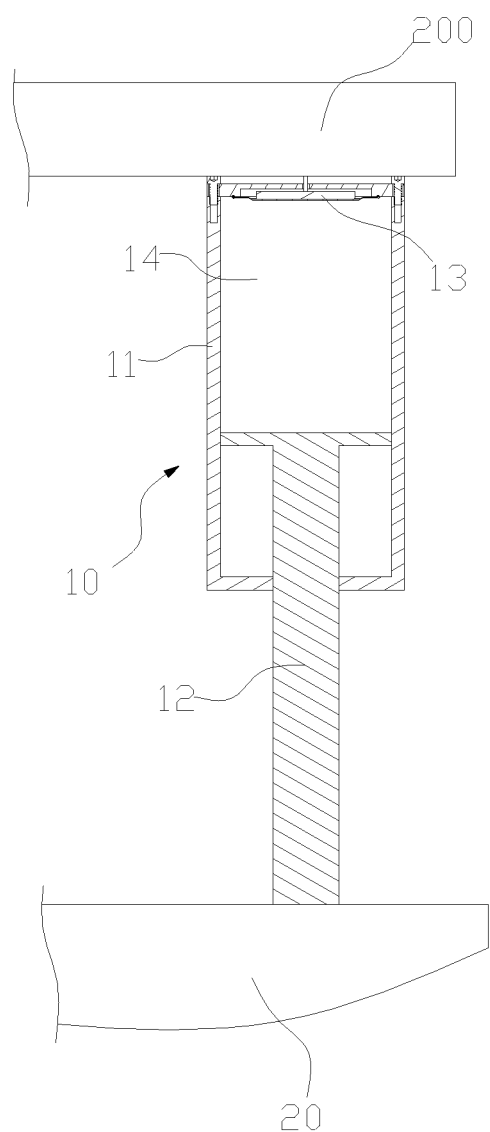
FIG. 4 is a working diagram of a power generator provided by some embodiments of the present application.

Please refer to FIG. 4, FIG. 4 is an installing diagram of a power generator 10 provided by some embodiments of the present application; one of the moving member 12 and the cylinder body 11 in the power generator 10 may be connected to the connecting arm 20, and another of the moving member 12 and the cylinder body 11 may be connected to the frame 200. In the vibration process of the frame 200, the moving member 12 is in relative motion with respect to the cylinder body 11 to make the piezoelectric conversion unit 13 generate electric energy, thus effectively utilizing energy generated by the frame 200 in the vibration process.

Illustratively, in the FIG. 4, the cylinder body 11 is installed on the frame 200, and the moving member 12 is installed on the connecting arm 20.

Electric energy generated by the piezoelectric conversion unit 13 may be stored in the battery 400 (not shown in FIG. 1) of the vehicle 1000. A transducer (not shown) may be arranged between the piezoelectric conversion unit 13 and the battery 400, and the piezoelectric conversion unit 13 is electrically connected to the transducer, and the transducer is electrically connected to the battery 400. The transducer is responsible for processing unstable voltage and current generated by the piezoelectric conversion unit 13 and then transferring the processed voltage and current to the battery 400 to be stored as energy. Certainly, the electric energy generated by the piezoelectric conversion unit 13 may be directly supplied to electric apparatus of the vehicle 1000, for example, unstable voltage and current generated by the piezoelectric conversion unit 13 is directly supplied to the electric apparatus of the vehicle 1000 by the transducer.

Among them, the cylinder body 11 may be of an integral structure; the cylinder body 11 may be of a split structure, for example, the cylinder body 11 comprises a plurality of portions which may be separated from each other. The cylinder body 11 may be cylindrical, square and the like.

The moving member 12 may be a rod member, such as a piston rod. Two axial ends of the moving member 12 are an extension end 121 and a free end 122 respectively, the extension end 121 of the moving member 12 is movably arranged in the cylinder body 11, and the free end 122 is located outside the cylinder body 11. A variable cavity 14 is defined by an end face of the extension end 121 of the moving member 12 and an inner surface wall of the cylinder body 11.

A piezoelectric conversion device may be installed on the cylinder body 11, or may be installed on the moving member 12.

In some embodiments, the piezoelectric conversion unit 13 may be deformed under compression by the action of a medium in the variable cavity 14 to generate electric energy.

That is, the medium in the variable cavity 14 plays a role in transferring force; when the moving member 12 is in relative motion with respect to the cylinder body 11 to reduce the variable cavity 14, the medium in the variable cavity 14 transfers an external force applied to the moving member 12 or the cylinder body 11 to the piezoelectric conversion unit 13, and the piezoelectric conversion unit 13 is deformed under the pressure applied by the medium to generate electric energy.

It should be noted that the medium in the variable cavity 14 may be gas, such as air, when the moving member 12 is in relative motion with respect to the cylinder body 11 to reduce the variable cavity 14, the gas in the variable cavity 14 is compressed, to make the piezoelectric conversion unit be deformed under compression to generate electric energy; and the medium in the variable cavity 14 may also be liquid, such as hydraulic oil.

Figure 5:
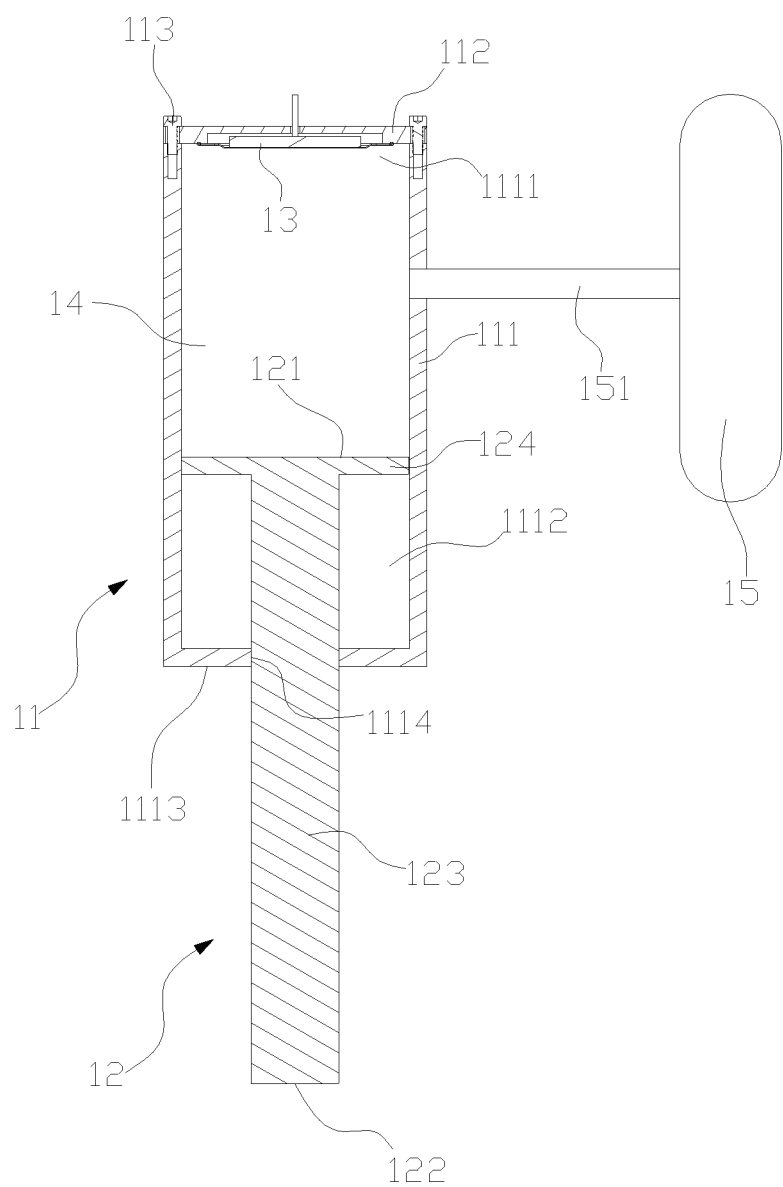
FIG. 5 is a structure diagram of a power generator provided by some further embodiments of the present application.

In some embodiments, please refer to FIG. 5, FIG. 5 is a structure diagram of a power generator 10 provided by some other embodiments of the present application; the power generator 10 further comprises a medium conveying device 15, the medium conveying device 15 is communicated with the variable cavity 14, the medium conveying device 15 is used for providing a medium for the variable cavity 14 when the variable cavity 14 becomes larger, and is used for storing the medium flowing out of the variable cavity 14 when the variable cavity 14 becomes smaller.

In the above structure, the medium conveying device 15 may provide the medium for the variable cavity 14 when the variable cavity 14 becomes larger as well as accommodate the medium flowing out of the variable cavity 14 when the variable cavity 14 becomes smaller, that is, in the process that the moving member 12 or the cylinder body 11 reciprocates due to vibration of the frame 200, when the variable cavity 14 becomes larger, the medium conveying device 15 inputs the medium into the variable cavity 14; when the variable cavity 14 becomes smaller, the medium flowing out of the variable cavity 14 enters the medium conveying device 15. Such structure may guarantee occurrence of large displacement between the moving member 12 and the cylinder body 11.

Optionally, the medium conveying device 15 is an elastomer with an expandable internal space, and the internal space of the elastomer is communicated with the variable cavity 14.

The internal space of the elastomer is also variable, and the internal space of the elastomer and the variable cavity 14 may compensate for each other. When the variable cavity 14 becomes smaller, the medium flowing out of the variable cavity 14 enters the elastomer, and thus the elastomer expands; and when the variable cavity 14 becomes larger, the elastomer inputs the medium into the variable cavity 14, and the elastomer shrinks. The medium conveying device 15 with such structure is simple in structure and may be automatically adaptive to the change of the variable cavity 14.

Illustratively, the elastomer is connected to the cylinder body 11 through a communicating pipe 151, and the variable cavity 14 is communicated with the internal space of the elastomer through the communicating pipe 151.

The elastomer may be an expendable capsule made of rubber.

In the embodiment, the medium provided by the medium conveying device 15 may be liquid, or may be gas.

In other embodiments, the medium conveying device 15 may also be other structures, for example, the medium conveying device 15 is a hydraulic system for supplying liquid to the variable cavity 14, or, the medium conveying device 15 is a pneumatic system for supplying gas to the variable cavity 14.

In the embodiments of the present application, in addition to making the piezoelectric conversion unit 13 deform by applying pressure to the piezoelectric conversion unit 13 by means of the medium in the variable cavity 14, the piezoelectric conversion unit 13 may be deformed by other means.

Figure 6:
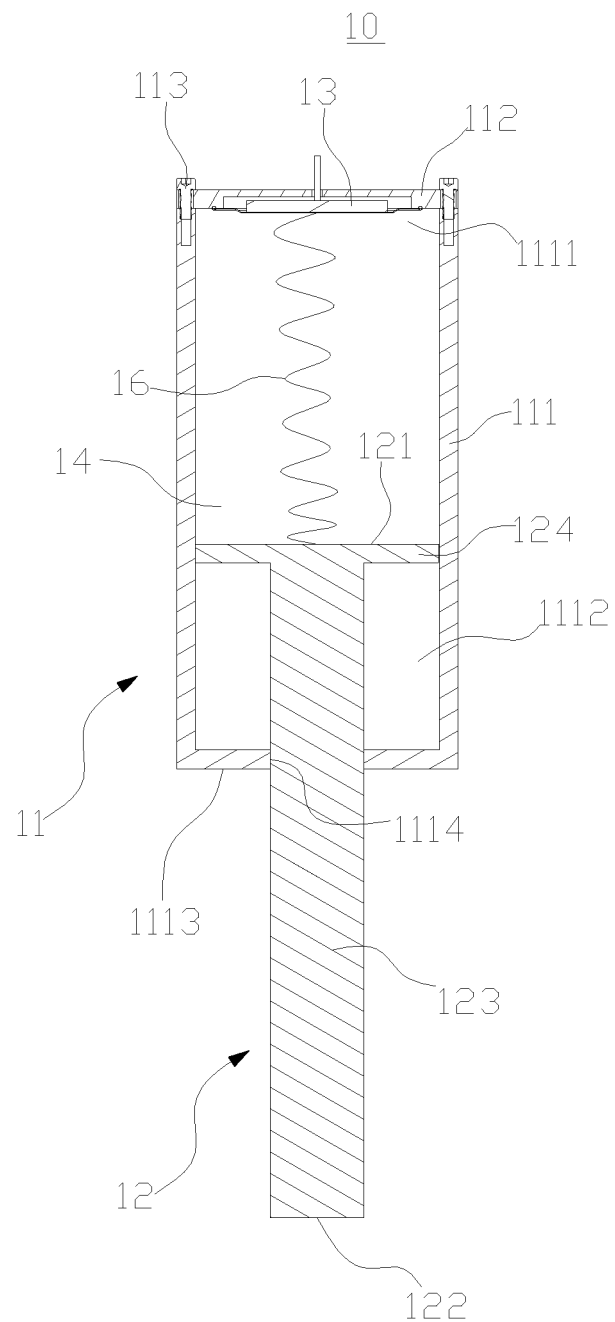
FIG. 6 is a structure diagram of a power generator provided by yet further embodiments of the present application.

In some embodiments, please refer to FIG. 6, FIG. 6 is a structure diagram of a power generator 10 provided by yet further embodiments of the present application; the moving member 12 is connected to the piezoelectric conversion unit 13 or the cylinder body 11 is connected to the piezoelectric conversion unit 13 through a force transfer member 16; in the process that the moving member 12 is in relative motion with respect to the cylinder body 11, the external force applied to the moving member 12 or the cylinder body 11 may be transferred to the piezoelectric conversion unit 13 through the force transfer member 16, to make the piezoelectric conversion unit 13 deform under compression.

When the piezoelectric conversion unit 13 is installed on the moving member 12, the force transfer member 16 is connected between the piezoelectric conversion unit 13 and the cylinder body 11; as shown in FIG. 6, when the piezoelectric conversion unit 13 is installed on the cylinder body 11, the force transfer member 16 is connected between the moving member 12 and the piezoelectric conversion unit 13.

Illustratively, the force transfer member 16 may be elastic member, one end of the elastic member is connected to the piezoelectric conversion unit 13, and the other end of the elastic member is connected to the moving member 12. The elastic member may be a spring, elastic rubber, and the like. FIG. 6 illustrates a condition that the elastic member is the spring.

The force transfer member 16 plays a role in connecting the piezoelectric conversion unit 13 and the moving member 12, the piezoelectric conversion unit 13 may be deformed under the pulling function of the moving member 12 when the variable cavity 14 is enlarged, and also may be deformed under the pushing function of the moving member 12 when the variable cavity 14 is reduced.

In some embodiments, as shown in FIG. 3, FIG. 5 and FIG. 6, the piezoelectric conversion unit 13 is installed on the cylinder body 11 and faces the extension end 121 of the moving member 12.

As shown in FIG. 3 and FIG. 5, in a structure for force transfer through the medium in the variable cavity 14, due to the fact that the piezoelectric conversion unit 13 faces the extension end 121 of the moving member 12, when the moving member 12 is in relative motion with respect to the cylinder body 11 to reduce the variable cavity 14, an extrusion force applied to the medium in the variable cavity 14 by the extension end 121 may be transferred to the piezoelectric conversion unit 13 more effectively through the medium, and thus the piezoelectric conversion unit 13 is easier to deform, and the conversion efficiency of converting mechanical energy generated by the relative motion of the moving member 12 with respect to the cylinder body 11 into electric energy is improved.

As shown in FIG. 6, in the structure for force transfer through the force transfer member 16, due to the piezoelectric conversion unit 13 faces the extension end 121 of the moving member 12, a force transfer effect of the force transfer member 16 is better, and the piezoelectric conversion unit 13 is easier to deform under the action of the force transfer member 16, and the conversion efficiency of converting mechanical energy generated by the relative movement of the moving member 12 with the cylinder body 11 into electric energy is improved.

Optionally, please continue to refer to FIG. 3, FIG. 5 and FIG. 6, the cylinder body 11 comprises a cylinder main body 111 and a cover body 112. An accommodating space 1112 with an opening 1111 at one end is formed inside the cylinder main body 111, and the extension end 121 is located in the accommodating space 1112. The cover body 112 is used for covering an opening 1111, and the piezoelectric conversion unit 13 is used for being installed on one side, facing the extension end 121, of the cover body 112.

In the above structure, the cylinder body 11 comprises two portions, namely the cylinder main body 111 and the cover body 112; the cover body 112 is used for covering the opening 1111 of the cylinder main body 111, and the cylinder body 11 is of a split structure convenient for installing and detaching the piezoelectric conversion unit 13.

Among them, the one end, away from the opening 1111, of the cylinder main body 111 is a penetrating end 1113, and the penetrating end 1113 is provided with a through hole 1114 communicated with the accommodating space 1112. The moving member 12 comprises a rod part 123 and a head part 124, the head part 124 is arranged at one axial end of the rod part 123, the head part 124 and the rod part 123 are coaxially arranged, one end, away from the rod part 123, of the head part 124 is an extension end 121, and one end, away from the head part 124, of the rod part 123 is a free end 122. The head part 124 is located in the cylinder main body 111, the head part 124 forms a sliding seal with the cylinder body 11, the rod part 123 penetrates out of the through hole 1114 of the cylinder main body 111, such that the free end 122 is located outside the cylinder body 11.

Optionally, the cylinder body 11 also comprises a locking member 113, the locking member 113 is used for locking the cover body 112 to the cylinder body 11 to enhance the firmness after covering the cover body 112 on the opening 1111 of the cylinder body 11. The locking member 113 may be a bolt, a screw, and the like.

In other embodiments, the cylinder body 11 may also be detachable from the cover body 112 by other means, for example, the cover body 112 is screwed to the cylinder body 11; as another example, the cover body 112 is connected to the cylinder body 11 by a snap-fit.

Figure 7:
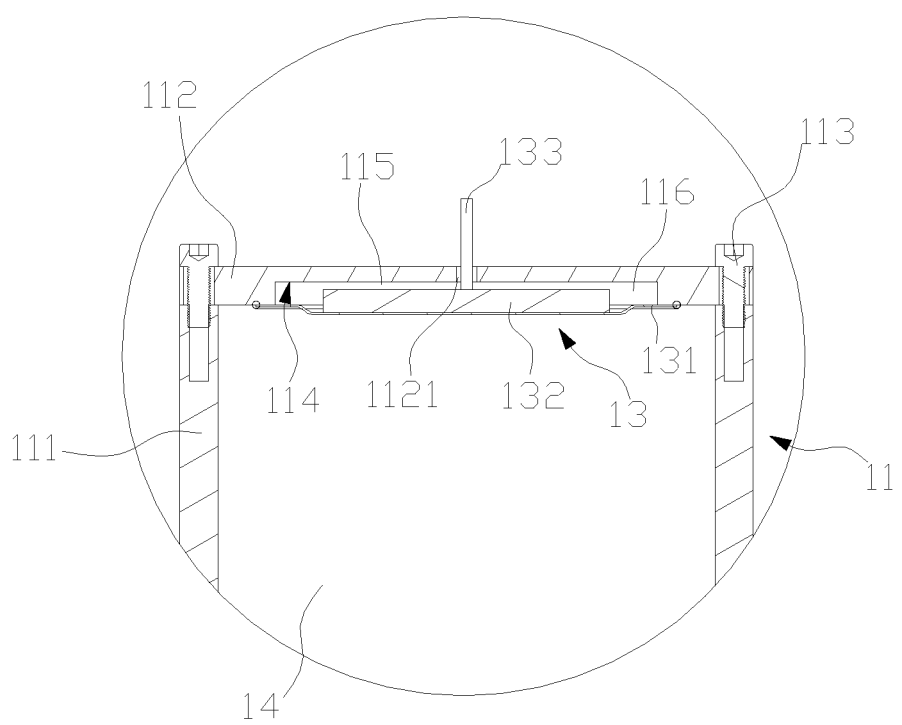
FIG. 7 is a partial enlarged view of a position A of a power generator shown in FIG. 3.

In some embodiments, please refer to FIG. 7, the FIG. 7 is a partial enlarged view of position A of a power generator 10 shown in FIG. 3; the cylinder body 11 is provided with a limiting part 114, the piezoelectric conversion unit 13 is installed on the cylinder body 11, a gap 115 exists between the piezoelectric conversion unit 13 and the limiting part 114, and the piezoelectric conversion unit 13 may abut against the limiting part 114 when deformed in the direction close to the limiting part 114.

Due to the fact that the gap 115 exists between the limiting part 114 and the piezoelectric conversion unit 13, the piezoelectric conversion unit 13 is ensured to be able to deform in a certain extent in the direction close to the limiting part 114 in the process that the moving member 12 (shown in FIG. 3) is in relative motion with respect to the cylinder body 11, for generating electric energy. The limiting part 114 has a certain restraining effect on deformation of the piezoelectric conversion unit 13, when the piezoelectric conversion unit 13 is deformed in the direction close to the limiting part 114 and abuts against the limiting part 114, the piezoelectric conversion unit 13 no longer continues to deform, and the piezoelectric conversion unit 13 is not prone to being damaged due to excessive deformation.

The gap 115 between the limiting part 114 and the piezoelectric conversion unit 13 may be 1 mm to 5 mm, for example, the gap 115 between the limiting part 114 and the piezoelectric conversion unit 13 may be 1 mm, 2 mm, 3 mm, 4 mm, or 5 mm Better power generation capacity of the piezoelectric conversion unit 13 is guaranteed, and the piezoelectric conversion unit 13 is not prone to being damaged due to excessive deformation.

Optionally, a groove 116 is provided on an inner wall of the cylinder body 11, the piezoelectric conversion unit 13 covers an opening end of the groove 116, the limiting part 114 is a groove bottom wall of the groove 116, and the piezoelectric conversion unit 13 may abut against the groove bottom wall when depressed into the groove 116 to deform. The groove 116 may make a space needed for deformation of the piezoelectric conversion unit 13, and thus the piezoelectric conversion unit 13 may be depressed and deform into the groove 116. In the process that the piezoelectric conversion unit 13 is depressed and deform into the groove 116, the piezoelectric conversion unit 13 may abut against the groove bottom wall of the groove 116, and the piezoelectric conversion unit 13 is not prone to being damaged due to excessive deformation.

Illustratively, the groove 116 is provided on the cover body 112 of the cylinder body 11. The piezoelectric conversion unit 13 covers the opening end of the groove 116 and forms a sealing connection with the cover body 112. A region, located between the piezoelectric conversion unit 13 and the extension end 121 (shown in FIG. 3) of the moving member 12, of the variable cavity 14 may be used for accommodating the medium.

Figure 8:
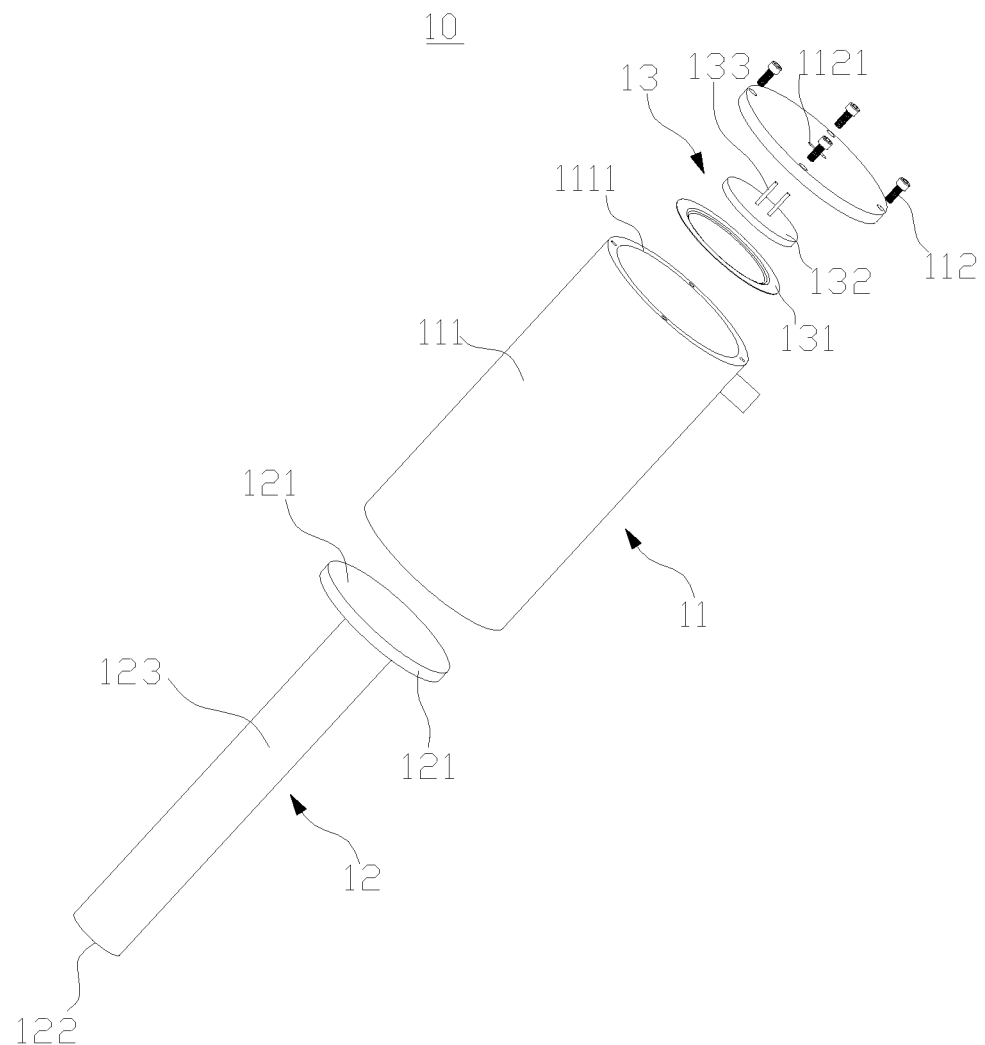
FIG. 8 is an exploded view of a power generator shown in FIG. 3.

In some embodiments, please refer to FIG. 8, FIG. 8 is an exploded view of a power generator 10 shown in FIG. 3, the piezoelectric conversion unit 13 comprises a pressure conduction plate 131 and a piezoelectric plate 132.

Please continue to refer to FIG. 7, the pressure conduction plate 131 covers the opening end of the groove 116, and the pressure conduction plate 131 is configured to deform when the moving member 12 (shown in FIG. 8) is in relative motion with respect to the cylinder body 11 and changes the size of the variable cavity 14. The piezoelectric plate 132 is installed on one side, which faces the groove 116, of the pressure conduction plate 131, the gap 115 is formed between an end face, away from the pressure conduction plate 131, of the piezoelectric plate 132 and the groove bottom wall, and the piezoelectric plate 132 is configured to generate electric energy when deformed along with the deformation of the pressure conduction plate 131.

The piezoelectric plate 132 is a power generating element, the pressure conduction plate 131 may drive the piezoelectric plate 132 to deform to generate electric energy. Due to the fact that the pressure conduction plate 131 covers the opening end of the groove 116 and the piezoelectric plate 132 is installed on one side, which faces the groove 116, of the pressure conduction plate 131, the pressure conduction plate 131 blocks the piezoelectric plate 132 in the groove 116, the piezoelectric plate 132 may be well protected by the pressure conduction plate 131, and the service life of the piezoelectric plate 132 is prolonged.

Among them, the pressure conduction plate 131 covers the opening end of the groove 116 and forms a sealing connection with the cover body 112, a sealing ring may be arranged between the pressure conduction plate 131 and the cover body 112 to improve sealing between the pressure conduction plate 131 and the cover body 112. The pressure conduction plate 131 may be connected to the cover body 112 through a connecting member such as a bolt, a screw and the like, the pressure conduction plate 131 also may be connected to the cover body 112 in an adhesion manner. The pressure conduction plate 131 may be a plate body capable of undergoing elastic deformation, such as a metal plate, a plastic plate, or the like. The piezoelectric plate 132 may be a piezoelectric ceramic plate. The piezoelectric plate 132 may be connected to the pressure conduction plate 131 in an adhesion manner.

Optionally, the cylinder body 11 may be provided with a threaded hole 1121 communicated with the groove 116, and the threaded hole 1121 is used for a wire 133 of the piezoelectric plate 132 to penetrate out of the internal of the cylinder body 11.

Illustratively, the threaded hole 1121 is provided on the cover body 112 of the cylinder body 11.

Figure 9:
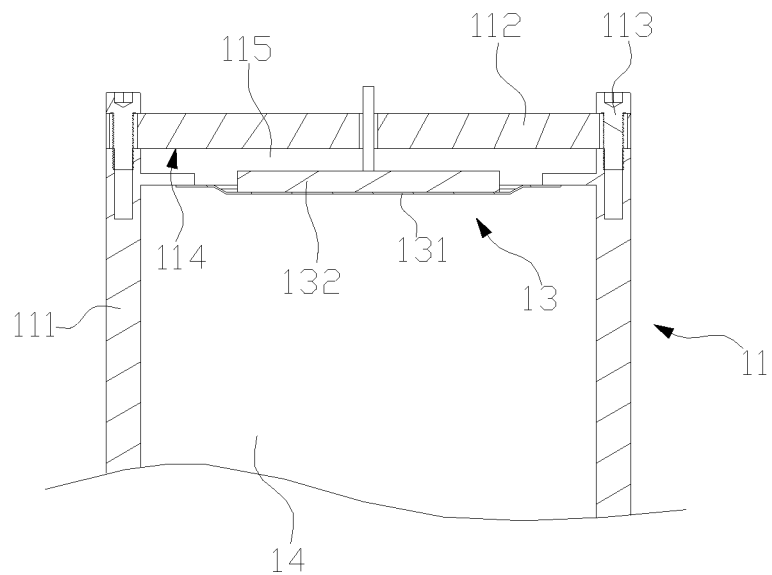
FIG. 9 is a partial view of a power generator provided by other embodiments of the present application.

According to the above embodiments, the piezoelectric conversion unit 13 may be installed on the cover body 112 of the cylinder body 11. In other embodiments, the piezoelectric conversion unit 13 may also be installed on the cylinder main body 111 of the cylinder body 11, for example, please refer to FIG. 9, FIG. 9 is a partial view of a power generator 10 provided by other embodiments of the present application. The pressure conduction plate 131 of the piezoelectric conversion unit 13 is installed on the cylinder main body 111 of the cylinder body 11, a gap 115 is formed between the piezoelectric plate 132 of the piezoelectric conversion unit 13 and the cover body 112 of the cylinder body 11, and an inner surface of the cover body 112 may serve as a limiting part 114 for limiting the deformation of the piezoelectric conversion unit 13.

It should be noted that the power generator 10 provided by the embodiments of the present application is not only suitable for a shock absorption structure of the vehicle 1000, but also suitable for other shock absorption structures, as long as the moving member 12 and the cylinder body 11 of the power generator 10 are respectively connected to two target members in relative vibrations, then the power generator 10 may convert mechanical energy generated by the target members into electric energy.

Figure 10:
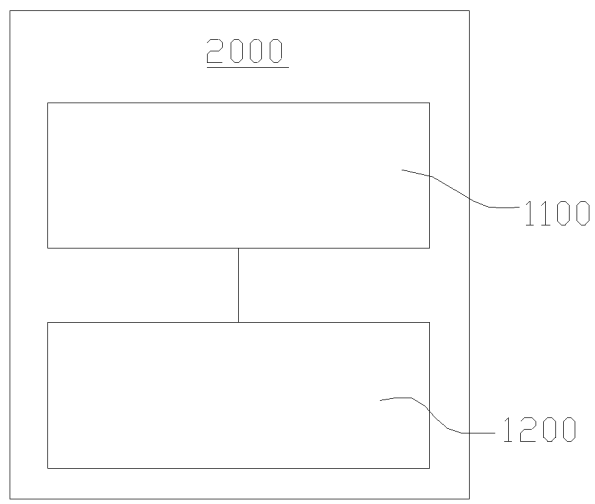
FIG. 10 is an illustrative block diagram of an apparatus for producing a power generator provided by some embodiments of the present application.

Please refer to FIG. 10, FIG. 10 is an illustrative block diagram of an apparatus 2000 for producing a power generator provided by some embodiments of the present application; the apparatus 2000 for producing the power generator comprises a providing device 1100 and an installing device 1200.

The providing device 1100 is used for providing a cylinder body 11, a moving member 12, and a piezoelectric conversion unit 13.

The installing device 1200 is used for installing the cylinder body 11, the moving member 12, and the piezoelectric conversion unit 13, to make the piezoelectric conversion unit 13 be located in a variable cavity 14 jointly defined by the moving member 12 and the cylinder body 11, where the piezoelectric conversion unit 13 is configured to deform when the moving member 12 is in relative motion with respect to the cylinder body 11 and changes the size of the variable cavity 14, for generating electric energy.

Figure 11:
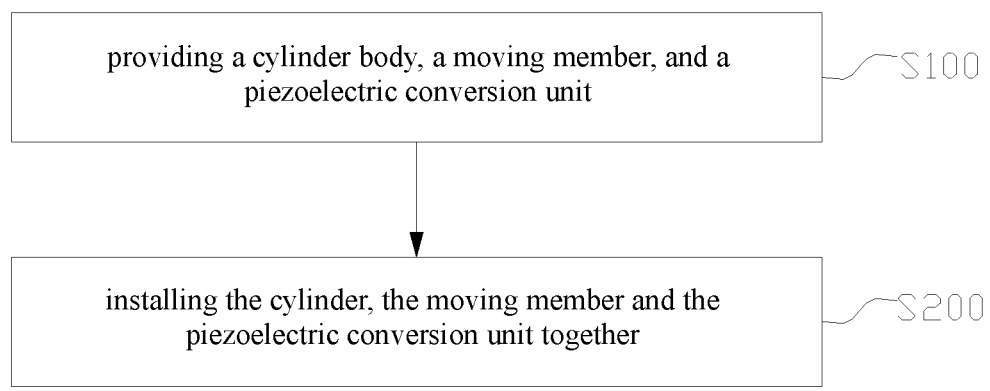
FIG. 11 is a flow diagram of a method for producing a power generator provided by embodiments of the present application.

Please refer to FIG. 11, FIG. 11 is a flow diagram of a method for producing a power generator 10 provided by embodiments of the present application; the method for producing the power generator 10 comprises:

S100: providing a cylinder body 11, a moving member 12, and a piezoelectric conversion unit 13;

S200: installing the cylinder body 11, the moving member 12, and the piezoelectric conversion unit 13 together, to make the piezoelectric conversion unit 13 be located in a variable cavity 14 jointly defined by the moving member 12 and the cylinder body 11, where the piezoelectric conversion unit 13 is configured to deform when the moving member 12 is in relative motion with respect to the cylinder body 11 and changes the size of the variable cavity 14, for generating electric energy.

It should be noted that the embodiments and the features in the embodiments in the present application may be combined with each other without conflict.

While the present application has been described with reference to preferred embodiments, various modifications may be made thereto and equivalents may be substituted for components thereof without departing from the scope of the present application. In particular, various technical features mentioned in the various embodiments may be combined in any way, as long as there is no structural conflict. The present application is not limited to the particular embodiments disclosed herein, but includes all technical solutions falling within the scope of the claims.

What is claimed is:

1. A power generator, comprising:
    a cylinder body;
    a moving member, wherein the moving member jointly defines a variable cavity with the cylinder body;
    a piezoelectric conversion unit, wherein the piezoelectric conversion unit is located in the variable cavity, and the piezoelectric conversion unit is configured to deform when the moving member is in relative motion with respect to the cylinder body and changes the size of the variable cavity, for generating electric energy;
    wherein the cylinder body is provided with a limiting part, the piezoelectric conversion unit is installed on the cylinder body, a gap exists between the piezoelectric conversion unit and the limiting part, and the piezoelectric conversion unit is capable of abutting against the limiting part when deformed in the direction close to the limiting part; and
    wherein a groove is provided on an inner wall of the cylinder body, the piezoelectric conversion unit covers an opening end of the groove, the limiting part is a groove bottom wall of the groove, and the piezoelectric conversion unit is capable of abutting against the groove bottom wall when depressed into the groove to deform.

2. The power generator according to claim 1, wherein the piezoelectric conversion unit is configured to deform under compression by the action of a medium in the variable cavity.

3. The power generator according to claim 2, wherein the power generator further comprises:
    a medium conveying device, the medium conveying device is communicated with the variable cavity, and the medium conveying device is used for providing the medium for the variable cavity when the variable cavity becomes larger, and is used for storing the medium flowing out of the variable cavity when the variable cavity becomes smaller.

4. The power generator according to claim 3, wherein the medium conveying device is an elastomer with an expandable internal space;
    the internal space of the elastomer is communicated with the variable cavity.

5. The power generator according to claim 2, wherein the moving member is provided with an extension end movably arranged in the cylinder body;
    the piezoelectric conversion unit is installed on the cylinder body and faces the extension end.

6. The power generator according to claim 5, wherein the cylinder body comprises:
    a cylinder main body, an accommodating space with an opening at one end is formed inside the cylinder main body, and the extension end is located in the accommodating space; and
    a cover body, the cover body is used for covering the opening, and the piezoelectric conversion unit is used for being installed on one side, facing the extension end, of the cover body.

7. The power generator according to claim 6, wherein the cylinder body further comprises:
    a locking member, the locking member is used for locking the cover body to the cylinder main body.

8. The power generator according to claim 1, wherein the piezoelectric conversion unit comprises:
    a pressure conduction plate, the pressure conduction plate covers the opening end of the groove, and the pressure conduction plate is configured to deform when the moving member is in relative motion with respect to the cylinder body and changes the size of the variable cavity; and
    a piezoelectric plate, the piezoelectric plate is installed on one side, which faces the groove, of the pressure conduction plate, the gap is formed between an end face, away from the pressure conduction plate, of the piezoelectric plate and the groove bottom wall, and the piezoelectric plate is configured to generate electric energy when deformed along with the deformation of the pressure conduction plate.

9. The power generator according to claim 8, wherein the cylinder body is provided with a threaded hole communicated with the groove, and the threaded hole is used for a wire of the piezoelectric plate to penetrate out of the internal of the cylinder body.

10. The power generator according to claim 1, wherein the gap is 1 mm-5 mm.

11. A suspension for being connected between a frame and a wheel, wherein the suspension comprises:
    a connecting arm, for installing a wheel; and
    the power generator according to claim 1, one of the cylinder body and the moving member is connected to the connecting arm, and the other one of the two is used for being connected to the frame.

12. A vehicle, comprising the suspension according to claim 11.

13. An apparatus for producing a power generator, comprising:
    a providing device, for providing a cylinder body, a moving member, and a piezoelectric conversion unit; and
    an installing device, for installing the cylinder body, the moving member, and the piezoelectric conversion unit, to make the piezoelectric conversion unit be located in a variable cavity jointly defined by the moving member and the cylinder body, wherein the piezoelectric conversion unit is configured to deform when the moving member is in relative motion with respect to the cylinder body and changes the size of the variable cavity, for generating electric energy;
    wherein the cylinder body is provided with a limiting part, the piezoelectric conversion unit is installed on the cylinder body, a gap exists between the piezoelectric conversion unit and the limiting part, and the piezoelectric conversion unit is capable of abutting against the limiting part when deformed in the direction close to the limiting part;

a groove is provided on an inner wall of the cylinder body, the piezoelectric conversion unit covers an opening end of the groove, the limiting part is a groove bottom wall of the groove, and the piezoelectric conversion unit is capable of abutting against the groove bottom wall when depressed into the groove to deform.

\* \* \* \* \*